(12) United States Patent
Hussell (10) Patent No.: US 8,269,244 B2
(45) Date of Patent: Sep. 18, 2012

(54) LED PACKAGE WITH EFFICIENT, ISOLATED THERMAL PATH

(75) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/853,812

(22) Filed: Aug. 10, 2010

(65) Prior Publication Data
US 2011/0316022 A1     Dec. 29, 2011

Related U.S. Application Data

(63) Continuation-in-part of application No. 12/825,075, filed on Jun. 28, 2010.

(51) Int. Cl.
*H01L 33/64* (2010.01)
(52) U.S. Cl. .................. 257/98; 257/712; 257/E33.068
(58) Field of Classification Search .................. 257/98, 257/99, 100, 459, 707, 745, 791, 88, 666, 257/E23.066, E33.072, E33.058; 29/592.1; 438/27
See application file for complete search history.

(56) References Cited

U.S. PATENT DOCUMENTS

| | | | |
|---|---|---|---|
| 4,679,118 A | 7/1987 | Johnson et al. | |
| 6,610,563 B1 | 8/2003 | Waitl | |
| 6,828,170 B2 | 12/2004 | Roberts et al. | |
| 6,921,927 B2 * | 7/2005 | Ng et al. | 257/99 |
| 6,936,855 B1 | 8/2005 | Harrah | |
| 6,943,433 B2 | 9/2005 | Kamada | |
| D514,073 S | 1/2006 | Suenaga | |
| 7,081,661 B2 | 7/2006 | Takehara et al. | |
| 7,098,483 B2 * | 8/2006 | Mazzochette et al. | 257/81 |
| 7,224,047 B2 | 5/2007 | Carberry et al. | |
| 7,244,965 B2 | 7/2007 | Andrews et al. | |
| D566,055 S | 4/2008 | Kim | |
| D573,113 S | 7/2008 | Bando | |
| D573,114 S | 7/2008 | Min et al. | |
| 7,400,049 B2 | 7/2008 | Shim | |
| 7,429,790 B2 | 9/2008 | Condie et al. | |

(Continued)

FOREIGN PATENT DOCUMENTS

CN     200930286397.5     10/2010

(Continued)

OTHER PUBLICATIONS

Taiwanese Office Action for Appl. No. 099305566 dated Jul. 12, 2011.

(Continued)

*Primary Examiner* — Roy Potter
(74) *Attorney, Agent, or Firm* — Jenkins, Wilson, Taylor & Hunt, P.A.

(57) ABSTRACT

Packages for containing one or more light emitting devices, such as light emitting diodes (LEDs), are disclosed with an efficient, isolated thermal path. In one embodiment, LED package can include a thermal element and at least one electrical element embedded within a body. The thermal element and electrical element can have the same and/or substantially the same thickness and can extend directly from a bottom surface of the LED package such that they are substantially flush with or extend beyond the bottom surface of the LED package. The thermal and electrical element have exposed portions which can be substantially flush with lateral sides of the body such that the thermal and electrical element do not have a significant portion extending beyond an outermost edge of the lateral sides of the body.

28 Claims, 5 Drawing Sheets

U.S. PATENT DOCUMENTS

| | | | |
|---|---|---|---|
| 7,432,589 | B2 | 10/2008 | Yamamoto et al. |
| D580,375 | S | 11/2008 | Yen |
| D580,381 | S | 11/2008 | Bando |
| D580,891 | S | 11/2008 | Sung et al. |
| 7,456,499 | B2 | 11/2008 | Loh |
| 7,462,870 | B2 | 12/2008 | Nakashima |
| D584,699 | S | 1/2009 | Bando |
| D594,827 | S | 6/2009 | Loh et al. |
| D595,675 | S | 7/2009 | Wang et al. |
| 7,564,180 | B2 | 7/2009 | Brandes |
| D597,968 | S | 8/2009 | Kobayakawa et al. |
| D597,971 | S | 8/2009 | Kobayakawa et al. |
| D598,400 | S | 8/2009 | Bando |
| 7,592,638 | B2 | 9/2009 | Kim |
| D614,592 | S | 4/2010 | Hussell et al. |
| 7,692,206 | B2 | 4/2010 | Loh |
| D615,504 | S | 5/2010 | Keller et al. |
| 7,719,024 | B2 | 5/2010 | Bando |
| D621,798 | S | 8/2010 | Lu et al. |
| D621,799 | S | 8/2010 | Hussell et al. |
| D622,680 | S | 8/2010 | Lin et al. |
| D626,095 | S | 10/2010 | Hseih |
| D627,310 | S | 11/2010 | Lin et al. |
| D628,541 | S | 12/2010 | Lin |
| D632,267 | S | 2/2011 | Chen et al. |
| D632,659 | S | 2/2011 | Hsieh |
| D634,284 | S | 3/2011 | Ko et al. |
| D634,285 | S | 3/2011 | Ko et al. |
| D634,286 | S | 3/2011 | Ko et al. |
| D635,527 | S | 4/2011 | Hussell et al. |
| 7,923,739 | B2 | 4/2011 | Hussell |
| D641,719 | S | 7/2011 | Hussell et al. |
| D643,819 | S | 8/2011 | Joo et al. |
| 2001/0045640 | A1 | 11/2001 | Oida et al. |
| 2002/0004251 | A1 | 1/2002 | Roberts et al. |
| 2004/0079957 | A1 | 4/2004 | Andrews et al. |
| 2004/0126913 | A1 | 7/2004 | Loh |
| 2006/0157726 | A1 | 7/2006 | Loh et al. |
| 2006/0220050 | A1 | 10/2006 | Higaki et al. |
| 2007/0052074 | A1 | 3/2007 | Hasegawa |
| 2007/0075325 | A1 | 4/2007 | Baek et al. |
| 2008/0006837 | A1 | 1/2008 | Park et al. |
| 2008/0185605 | A1 | 8/2008 | Wada et al. |
| 2008/0258162 | A1 | 10/2008 | Koung et al. |
| 2008/0278941 | A1 | 11/2008 | Logan et al. |
| 2008/0290353 | A1 | 11/2008 | Medendorp et al. |
| 2009/0159905 | A1 | 6/2009 | Chen |
| 2009/0189178 | A1 | 7/2009 | Kim et al. |
| 2010/0059783 | A1 | 3/2010 | Chandra |
| 2010/0133554 | A1 | 6/2010 | Hussell |
| 2010/0133578 | A1 | 6/2010 | Pickard et al. |
| 2010/0155748 | A1 | 6/2010 | Chan et al. |
| 2011/0006658 | A1 | 1/2011 | Chan |
| 2011/0031865 | A1 | 2/2011 | Hussell et al. |
| 2011/0180827 | A1 | 7/2011 | Hussell |
| 2011/0186873 | A1 | 8/2011 | Emerson |

FOREIGN PATENT DOCUMENTS

| | | |
|---|---|---|
| JP | D1102760 | 3/2001 |
| JP | 2008-091792 | 4/2008 |
| JP | 2008-103480 | 5/2008 |
| JP | D1346959 | 12/2008 |
| JP | 1416396 | 5/2011 |
| KR | 1020070000130 A | 1/2007 |
| KR | 1020090003378 A | 1/2009 |
| WO | WO 2007/126720 | 11/2007 |

OTHER PUBLICATIONS

EP Community Design No. 001242234, Jan. 5, 2011, Cree, Inc.
Description Model No. NS6x083x issued by Nichia Corporation—at least as early as Feb. 17, 2007.
Description Model No. NS6G083 issued by Nichia Corporation—at least as early as Aug. 31, 2007.
U.S. Appl. No. 29/338,186, filed Jun. 5, 2009.
Co-pending U.S. Appl. No. 12/498,856, filed Jul. 7, 2009.
Notice of Allowance from U.S. Appl. No. 29/330,657 dated Sep. 25, 2009.
U.S. Appl. No. 29/353,652, filed Jan. 12, 2010.
Notice of Allowance dated Apr. 16, 2010 from U.S. Appl. No. 29/338,186.
U.S. Appl. No. 29/360,791, filed Apr. 30, 2010.
Non-Final Office Action for U.S. Appl. No. 12/479,318 dated Jun. 2, 2010.
Related U.S. Appl. No. 29/365,939, filed Jul. 16, 2010.
Notice of Allowance for U.S. Appl. No. 29/353,652 dated Aug. 24, 2010.
U.S. Appl. No. 61/404,985, filed Oct. 13, 2010.
Non-final Office Action for U.S. Appl. No. 12/479,318 dated Nov. 10, 2010.
Notice of Allowance for U.S. Appl. No. 29/353,652 dated Nov. 26, 2010.
Supplemental Notice of Allowance for U.S. Appl. No. 29/353,652 dated Dec. 8, 2010.
Related CIP U.S. Appl. No. 12/969,267, filed Dec. 15, 2010 entitled "Solid State Lighting Devices and Methods" (Filed With Non-Publication Request).
Notice of Allowance for U.S. Appl. No. 29/360,791 dated Dec. 22, 2010.
Notice of Allowance for U.S. Appl. No. 29/365,939 dated Dec. 27, 2010.
Related U.S. Appl. No. 29/382,394, filed Jan. 3, 2011.
International Search Report/Written Opinion dated Jan. 5, 2011 for PCT/US2010/035379.
U.S. Appl. No. 13/011,609, filed Jan. 21, 2011.
Supplemental Notice of Allowance for U.S. Appl. No. 29/360,791 dated Jan. 24, 2011.
Notice of Allowance for U.S. Appl. No. 12/479,318 dated Feb. 17, 2011.
Notice of Allowance for U.S. Appl. No. 29/338,186 dated Mar. 10, 2011.
Notice of Allowance for Japanese Design Appl. No. 2010-026186 dated Mar. 29, 2011.
Supplemental Notice of Allowability for U.S. Appl. No. 12/479,318 dated Apr. 5, 2011.
Notice of Allowance for U.S. Appl. No. 29/360,791 dated Apr. 12, 2011.
Notice of Allowance for U.S. Appl. No. 29/365,939 dated Apr. 12, 2011.
Supplemental Notice of Allowance for U.S. Appl. No. 29/338,186 dated May 20, 2011.
Certificate of Registration for Community Design Application Serial No. 001283600-0001-0003 dated Jan. 7, 2011.
Japanese Office Action for JP2010-026185 dated Apr. 5, 2011.
Notice of Allowance for U.S. Appl. No. 29/360,791 dated Jul. 21, 2011.
Notice of Allowance for U.S. Appl. No. 29/380,549 dated Jul. 28, 2011.
International Search Report and Written Opinion for PCT Application Serial No. PCT/US2011/41833 dated Oct. 24, 2011.
International Search Report and Written Opinion for PCT Application Serial No. PCT/US2011/043539 dated Oct. 28, 2011.
Notice of Allowance for Japanese Application Serial No. JP-DES 2011/015199 dated Nov. 10, 2011.
Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
International Preliminary Report on Patentability for PCT Application Serial No. PCT/US2010/035379 dated Dec. 8, 2011.
Notice of Allowance for U.S. Appl. No. 29/397,017 dated Dec. 9, 2011.

* cited by examiner

LED PACKAGE WITH EFFICIENT, ISOLATED THERMAL PATH

CROSS REFERENCE TO RELATED APPLICATIONS

This application relates and claims priority to and is a continuation-in-part application from co-pending U.S. utility patent application Ser. No. 12/825,075 filed Jun. 28, 2010, the entire content of which is hereby incorporated by reference herein.

TECHNICAL FIELD

The subject matter disclosed herein relates generally to packages for light emitting diodes (LEDs). More particularly, the subject matter disclosed herein relates to packages for LEDs that are low-cost and have an efficient, isolated thermal path.

BACKGROUND

Light emitting devices, such as light emitting diodes (LEDs) for example, are often packaged within surface mounted device (SMD) housings. These housings are often made of plastic and can be referred to as plastic leaded chip carriers (PLCCs). SMD housings typically feature an LED chip connected to multiple metal leads formed from a leadframe and can optionally comprise a heat slug. Current packages comprise portions of the metal leads which extend outside of the package and protrude from one or more lateral sides of the body. The increased surface area of the extended leads increase the capacity of the LED package to dissipate heat, however, the extended leads increase the size of the LED package requiring a relatively large area on a circuit board. Circuit board area is a scarce and costly factor in many applications. In addition, the extended leads require more metal during package fabrication which can increase overall package cost.

Figure 1A:
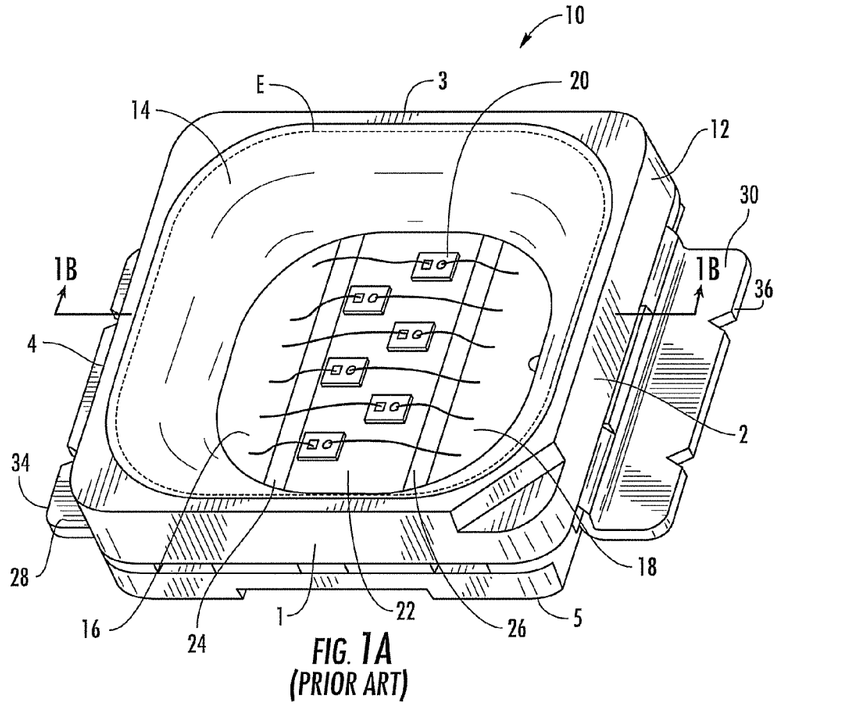
FIG. 1A illustrates a perspective top view of a LED package according to the prior art.
Figure 1B:
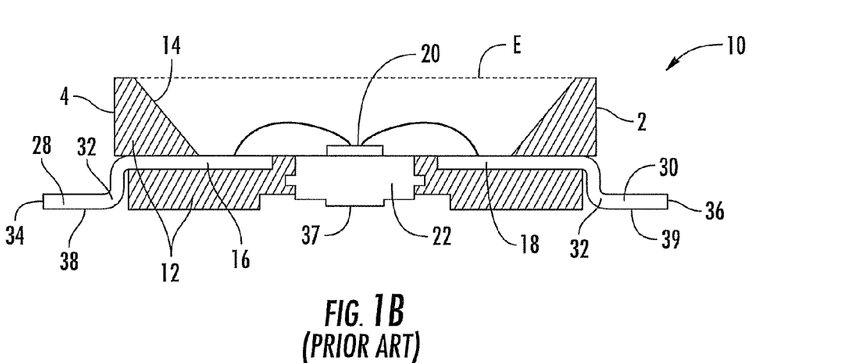
FIG. 1B illustrates a cross-sectional view of the LED package according to the prior art in FIG. 1A.

Examples of prior art LED packages are illustrated by FIGS. 1A-1B and 2A-2B. Referring to FIGS. 1A and 1B, a LED package, generally designated 10, has a body 12 typically formed from molded plastic, ceramic, thermoset, and/or thermoplastic materials. Body 12 includes four lateral sides 1-4, a bottom surface 5, and a reflector cavity 14. An encapsulant E fills the reflector cavity 14 to a desirable level, typically flush with the top of the reflector cavity. Encapsulant E typically contains a phosphor for producing a desired wavelength spectrum. Located along a bottom floor of the reflector cavity are electrical components, typically metal leads 16 and 18 formed from a leadframe, and to which one or more LED chips 20 are electrically connected. LED chips 20 can optionally be mounted to a heat slug 22 which is electrically and thermally isolated from the metal leads 16 and 18 by insulating portions 24 and 26, respectively, of the body 12. Heat slug 22 can improve thermal properties, including heat dissipation of LED package 10.

Conventional designs for packages having metal leads 16 and 18 utilize portions of the leads which extend outside or external to the plastic body in addition to portions which are encased or molded within the body. For example, FIG. 1B is a cross-sectional view along line 1B in FIG. 1A. FIG. 1B illustrates body 12 which is molded about portions of metal leads 16 and 18 and portion of the heat slug 22. External portions 28 and 30 of leads 16 and 18, respectively, protrude from and extend away from lateral sides 4 and 2 and beyond the outermost edges of the body 12. Metal leads 16 and 18 are separated from the leadframe by terminating, such as by shearing, the external ends 34 and 36 of the leads 16 and 18 from the leadframe. External portions 28 and 30 have a bend 32 which can configure the external portions 28 and 30 to extend away from each other and away from the body 12. As illustrated by FIG. 1B, this design utilizes metal leads 16 and 18 which differ in thickness, and are typically thinner with a smaller cross-sectional area than the heat slug 22. Heat slug 22 protrudes from bottom surface 5 of the body 12 and metal leads 16 and 18 protrude from lateral sides 2 and 4 of the body 12. All three of heat slug 22 and metal leads 16 and 18 become mounted to an external circuit source, generally a printed circuit board (PCB), at a location where they protrude from the body. For example, heat slug 22 comprises bottom surface 37 and metal leads 16 and 18 comprise bottom surfaces 38 and 39, respectively. These bottom surfaces are mounted to the PCB typically by using solder technology. In addition, the metal leads 16 and 18 have portions which are embedded on all four sides of the LED package 10. For example, metal leads 16 and 18 can be embedded but extend from the body at external portions 28 and 30 on two opposing sides of LED package 10, and can be embedded and flush with the remaining two opposing sides within the LED package 10. As such, the metal forming the metal leads 16 and 18 is located on all four sides of the LED package 10. Because the leads 16 and 18 contain portions 28 and 30 that extend from the body externally at lateral sides 2 and 4, extra processing steps of bending the metal leads causes LED package 10 to have both an increased cost and a larger footprint than necessary thereby increasing the amount of space needed on a PCB.

Figure 2A:
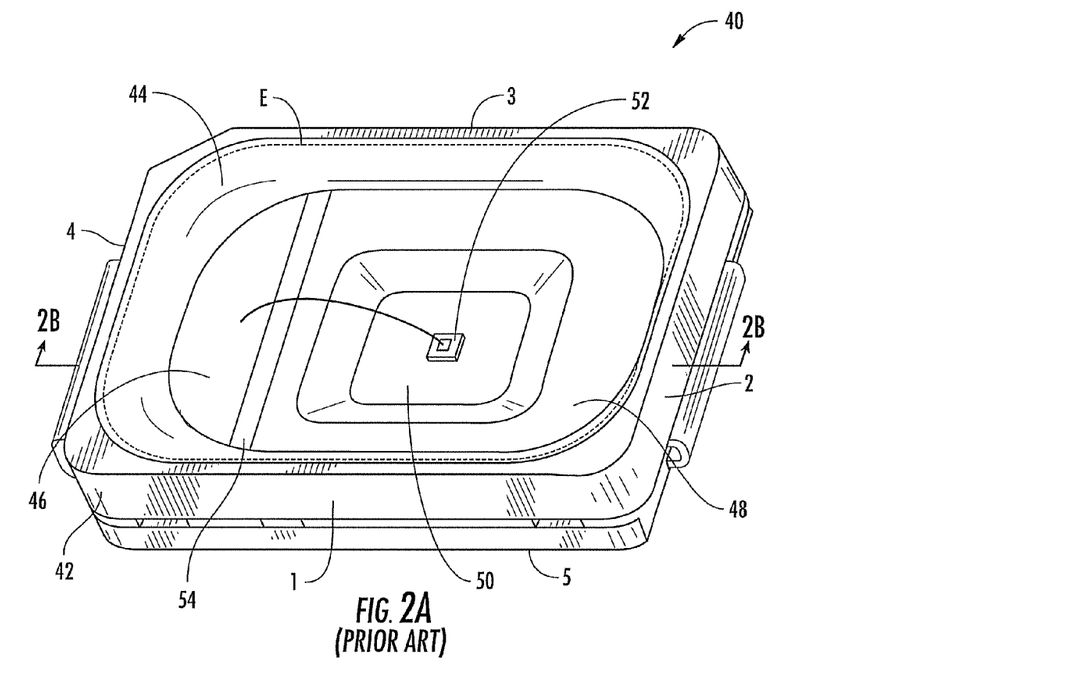
FIG. 2A illustrates a perspective top view of a LED package according to the prior art.
Figure 2B:
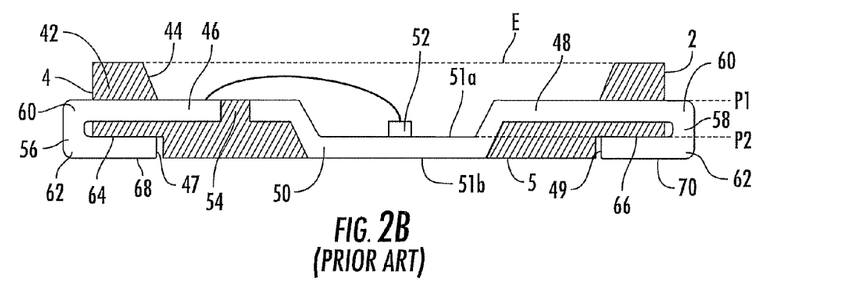
FIG. 2B illustrates a cross-sectional view of the LED package according to the prior art in FIG. 2A.

Referring to the prior art package illustrated by FIGS. 2A-2B, this design features an LED package generally designated 40, having a body 42 with lateral sides 1-4 and a bottom surface 5. This package design also features a reflector cavity 44 configured for receiving a desirable level of encapsulant E. In this package design, body 42 is molded about a first metal lead 46 and a second metal lead 48, wherein second metal lead 48 has a portion formed by stamping the metal to form a metal cup 50. Metal cup 50 forms metal walls about an inner bottom surface 51a located or disposed on a lower and different plane P2 than a surface of the body 42 forming one insulating portion 54 of the body which can be located or disposed on plane P1. Metal cup 50 forms one electrical contact upon which one or more LED chips 52 are mounted. In addition to forming an electrical contact, cup 50 also serves as the thermal element, or heat slug, and is thereby neither electrically nor thermally isolated from both metal leads 46 and 48. Cup 50 is thermally and electrically isolated from the first metal lead 46 by insulating portion 54 of the body. Cup 50 protrudes from bottom surface 5 of the body 42 to form an exposed portion 51b while first and second metal leads 46 and 48 have external portions 56 and 58, respectively which protrude from lateral sides 2 and 4 and extend beyond the outermost edges of the body 42. The first and second metal leads 46 and 48 are separated from the leadframe by shearing the external ends 47 and 49 from the leadframe. The external portions 56 and 58 of first and second metal leads 46 and 48, respectively, have external bends 60 and 62 which transition the external portions 56 and 58 to bend and/or wrap about body 42 such that they extend towards and face each other while also bending in towards metal cup 50. External portions 56 and 58 are disposed in recesses 64 and 66 of bottom surface 5 of body 42 to enable bottom surfaces 68 and 70 of external portions 56 and 58 to rest flush with and adjacent to the exposed portion 51b of the metal cup 50. These bottom surfaces are mounted to the PCB typically by using solder technology. As LED chip 52 is not thermally isolated from both first and second metal leads 46 and 48, the external source, for example the PCB will have to supply the isolation when connecting the LED package 10 components in series. For example, first and second metal leads 46 and 48 are thin and have a small cross-sectional area. For this reason, capacity of the metal leads to remove heat from the LED is limited. This limits the amount of power that can be sent to LED chips thereby limiting the amount of light that can be generated by the LED package. This design is similar to the design illustrated by FIGS. 1A and 1B as external portions 56 and 58 of first and second metal leads 46 and 48 thereby increases the footprint, includes a difficult bending step for the external portions, and increases the amount of metal necessary to fabricate the package which in turn increases cost and decreases space available on a PCB. In addition, this design utilizes metal leads 46 and 48 having portions which are embedded on all four sides of the LED package 40. For example, metal leads 46 and 48 are embedded but extend from the body at external portions 56 and 58 on two opposing sides of LED package 40, and are embedded and flush with the remaining two opposing sides within the LED package 40. As such, the metal forming the metal leads 46 and 48 is located on all four sides of the LED package 40.

Consequently, there remains a need for improved LED packages that overcome or alleviate shortcomings of prior art packages.

SUMMARY

In accordance with this disclosure, LED packages are provided that can comprise a smaller footprint and single leadframe thickness while maintaining thermal isolation. It is, therefore, an object of the present disclosure herein to provide LED packages with improved cost and reduced footprint.

These and other objects of the present disclosure as can become apparent from the disclosure herein are achieved, at least in whole or in part, by the subject matter described herein.

BRIEF DESCRIPTION OF THE DRAWINGS

A full and enabling disclosure of the subject matter disclosed herein including the best mode thereof to one of ordinary skill in the art is set forth more particularly in the remainder of the specification, including reference to the accompanying figures, in which.

DETAILED DESCRIPTION

Reference will now be made in detail to possible embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the subject matter disclosed herein. Furthermore, various aspects of the subject matter disclosed herein are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise III-V nitride (e.g., gallium nitride) based light emitting diodes (LEDs) or lasers fabricated on a silicon carbide substrate, such as those devices manufactured and sold by Cree, Inc. of Durham, N.C. Such LEDs and/or lasers may also be configured to operate such that light emission occurs through the substrate in a so-called "flip chip" orientation or by conventional wirebonding techniques.

Figure 3:
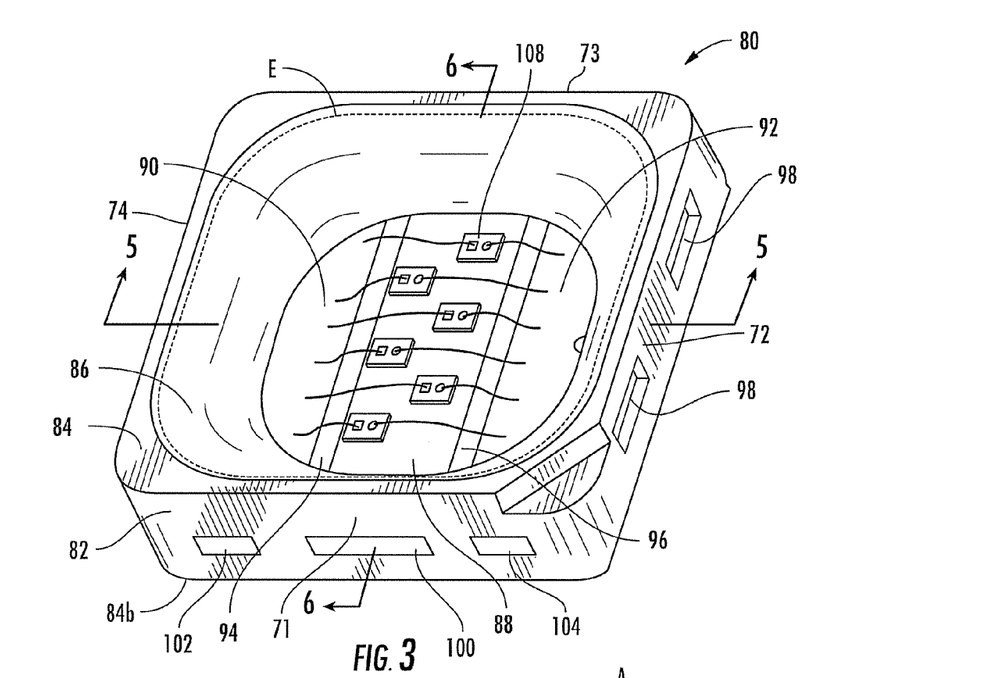
FIG. 3 illustrates a perspective top view of an embodiment of a LED package with electrical and thermal elements according to the subject matter herein.
Figure 4:
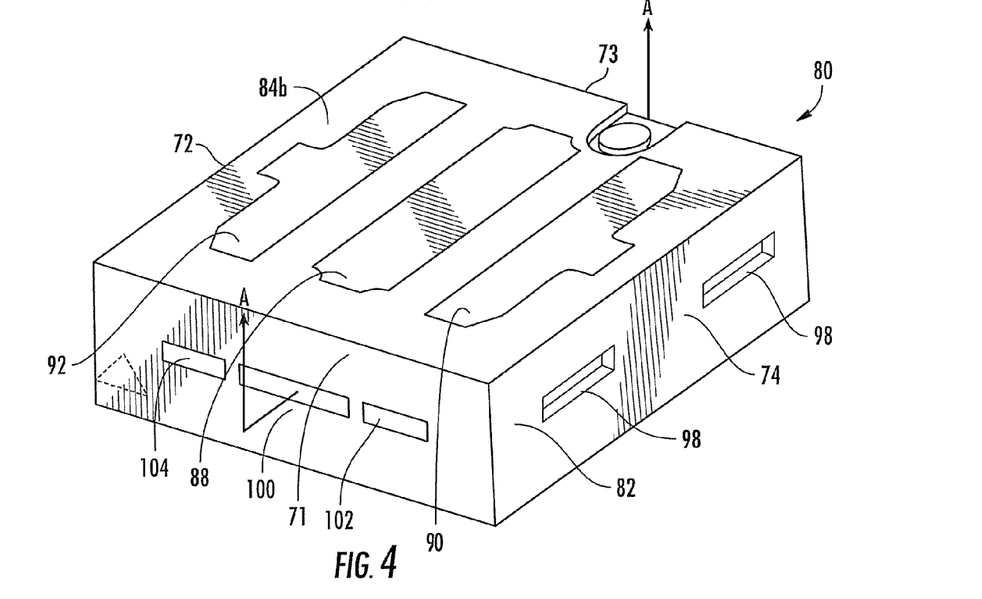
FIG. 4 illustrates a perspective bottom view of the LED package according to the subject matter herein and in FIG. 3.
Figure 5:
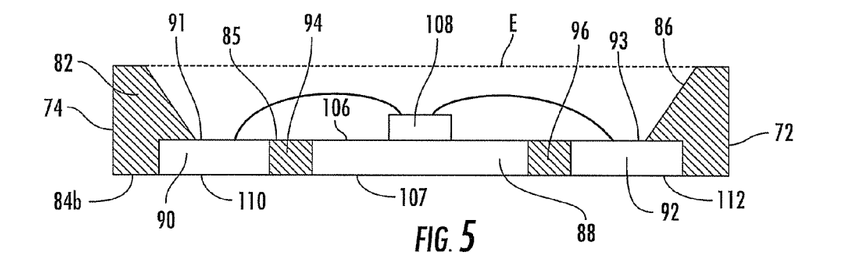
FIG. 5 illustrates a cross-sectional view of the LED package according to the subject matter herein and in FIG. 3.
Figure 6:
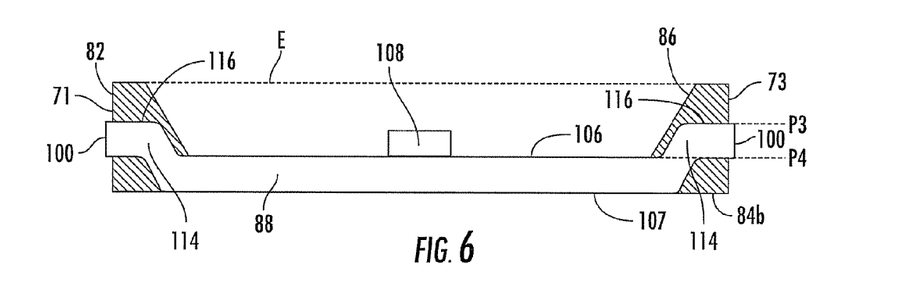
FIG. 6 illustrates an opposing cross-sectional view of the LED package according to the subject matter herein and in FIG. 3.

Referring now to FIGS. 3-8, FIG. 3 illustrates a top perspective view of one embodiment of a LED package, generally designated 80. Corresponding bottom perspective and cross-sectional views of LED package 80 are illustrated in FIGS. 4-6. LED package 80 can comprise a body 82 with four external lateral sides 71-74, a top surface 84*a*, and a bottom surface 84*b*. Body 82 can comprise any suitable material, for example ceramic, molded plastic, thermoset, or thermoplastic materials. Body 82 can comprise a reflector cavity 86 for reflection of light thereby increasing light output, and reflector cavity 86 can be filled with a suitable level of encapsulant E producing a desired wavelength spectrum. For illustration purposes, encapsulant E is filled to a level substantially flush with a top of reflector cavity 86 and flush with top surface 84a of the body 82 although the level could be even with or above the top of reflector cavity 86.

A thermal element and at least one electrical element can lie along a bottom surface 85 of reflector cavity 86. The thermal element can comprise a heat transfer material 88, for example a heat slug. The electrical element can comprise one or more metal leads, for example metal leads 90 and 92. Thermal transfer material 88 can optionally be disposed between metal leads 90 and 92, and can be thermally and electrically isolated from metal leads 90 and 92 by insulating portions 94 and 96 of molded body 82 which can form for example, during the molding process when molded material flows into divided areas between the thermal transfer material 88 and metal leads 90 and 92. It is also contemplated in another aspect that thermal transfer material 88 and metal leads 90 and 92 can comprise any other suitable configuration other than having the thermal transfer material 88 disposed between metal leads 90 and 92. Heat transfer material 88 and metal leads 90 and 92 can thus have at least a portion of each embedded within body 82. Body 82 can further comprise one or more retaining notches 98 along one or more lateral sides, for example along opposing lateral sides 72 and 74 which can assist with and handling and placement of LED package 80. For example, retaining notches 98 can provide areas which a leadframe having an array of package housings retains the housings in place until the appropriate time when the LED packages 80 are singulated.

As illustrated by FIG. 4, heat transfer material 88 and metal leads 90 and 92 can extend directly from bottom surface 84b of body 82 and can optionally be flush, or substantially flush, with bottom surface 84b. In an optional embodiment, heat transfer material 88 and metal leads 90 and 92 can extend directly from bottom surface 84b of body 82 and can extend lower than bottom surface 84b, that is to a greater distance away from the body than bottom surface 84b. Heat transfer material 88 and metal leads 90 and 92 can have longitudinal axes that can be substantially parallel along an axis A-A of the LED package 80. Further, heat transfer material 88 and metal leads 90 and 92 can be configured such that they can only extend directly from bottom surface 84b and can be embedded, therefore can be in contact with, two opposing lateral sides of the LED package 80. For example, the metals forming metal leads 90 and 92 are not embedded on all four lateral sides of the body as in the prior art, but rather are disposed between and have portions embedded in opposing lateral sides 71 and 73. In addition, and in one aspect, each component's respective perimeter, or footprint, can be surrounded and/or enclosed by bottom surface 84b of the body 82 such that heat transfer material 88 and metal leads 90 and 92 do not extend to any significant degree or portion beyond outermost edges of lateral sides 71-74 of the body 82. It is also possible though for metal leads 90 and 92 to extend from lateral sides 71-74 in another aspect, such as for example to form J-bend or gull-wing extensions in addition to extending directly from bottom surface 84b. Heat transfer material 88 can comprise exposed portions 100 that can be located or disposed along opposing lateral sides 71 and 73, and optionally adjacent lateral sides 72 and 74 with retaining notches 98. Retaining notches 98 could also be disposed along opposing lateral sides 72 and 74 which contain the exposed portions 100, 102, and 104. The exposed portion 100 of the thermal element is on a lateral side that is orthogonal to longitudinal axis A. Likewise, metal leads 90 and 92 can comprise exposed portions 102 and 104, respectively, which can be located or disposed along opposing lateral sides 71 and 73. The exposed portions 102 and 104 of metal leads 90 and 92 can also be disposed on a lateral side that is orthogonal to longitudinal axis A-A. Heat transfer material 88 and metal leads 90 and 92 are positioned within the body 82 to extend between the respective exposed portions 100, 102, and 104 and are generally parallel. Exposed portions 100, 102, and 104 can be located or disposed along a surface that is orthogonal to longitudinal axis A-A of the heat transfer material 88, and metal leads 90 and 92 and can be separated and/or sheared from a leadframe such that they are at least substantially flush with lateral sides 71 and 73. In this configuration, no significant portion of the thermal element 88 or metal leads 90 and 92 extends beyond the outermost edges of lateral sides 71-74 of body 82 of LED package 80. Separating and/or shearing can result in metal leads 90 and 92 at least substantially flush with opposing lateral sides 71 and 73.

Referring to FIGS. 5 and 6, heat transfer material 88 can comprise a top surface 106 upon which one or more LED chips 108 can optionally become mounted (FIG. 3). It is also contemplated in another aspect that one or more LED chips 108 can be thermally connected to heat transfer material 88 indirectly using another suitable configuration. For example, one or more intervening layers may be present between LED chips 108 and top surface 106 of heat transfer material 88. Metal leads 90 and 92 can comprise top surfaces 91 and 93, respectively. Top surfaces 106, 91, and 93 can be flush with the bottom surface of the reflector cavity 85 which also comprises insulating portions 94 and 96 of the body. LED chips 108 can electrically connect to the electrical elements, metal leads 90 and 92 through for example, conventional wirebonding. Heat transfer material 88 can draw heat away from LED chips 108 and dissipate the heat from a bottom surface 107 of the heat transfer material 88. Heat can travel from LED chip 108 and pass through the heat transfer material and along an isolated thermal path to an external source or substrate, for example a printed circuit board (PCB) or heat sink. FIG. 5 is a view along 5-5 of FIG. 3 and illustrates heat transfer material 88 can be of a same or substantially same thickness as metal leads 90 and 92. Metal leads 90 and 92 and heat transfer material 88 can optionally have the respective bottom surfaces 110, 112, and 107 flush or substantially flush with bottom surface 84b of LED package 80. In an alternative embodiment, metal leads 90 and 92 and heat transfer material 88 can optionally have the respective bottom surfaces 110, 112, and 107 located below bottom surface 84b of the LED package 80. That is, bottom surfaces 110, 112, and 107 extend from the body a greater distance than bottom surface 84b. As respective top surfaces 106, 91, and 93 and respective bottom surfaces 107, 110, and 112 of the heat transfer material and metal leads can be substantially flush with the bottom of the recess cavity 85 and the bottom of the LED package 84b, it follows that heat transfer material 88 and metal leads 90 and 92 can comprise a same or substantially the same thickness and/or height within the body 82.

As illustrated in FIG. 6, which is a cross section along 6-6 of FIG. 3, heat transfer material 88, which can parallel metal leads 90 and 92, can be stamped such that exposed portions 100, 102, and 104 are located and/or terminated at least substantially flush with the lateral edges 71 and 73 of LED package 80 such that no significant portion extends beyond outermost edges of LED package 80. FIG. 6 also illustrates bending portions 114 formed in heat transfer material 88 which can be embedded within body 82 and which are configured to transform the heat transfer material 88 from having top surface 106 that can be substantially flat along a plane P4 to a second, embedded top surface 116 that also can be substantially flat and located or disposed along a parallel plane P3 that can be located above plane P4. Heat transfer material 88 can then terminate with exposed portions 100 substantially flush with lateral sides 71 and 73 and on a plane higher than top surface 106. Similarly, metal leads 90 and 92, which can be parallel to heat transfer material 88 therefore, can also comprise bending portions which can transform the metal leads from top surfaces 91 and 93 along P4 to a second, embedded surface along P3 prior to terminating at exposed ends 102 and 104 which can be substantially flush with opposing lateral sides 71 and 73.

Figure 7:
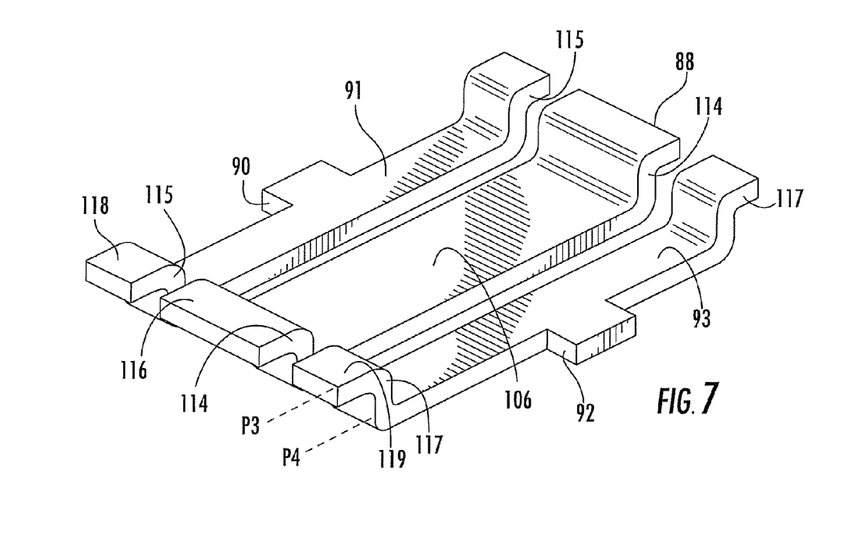
FIG. 7 illustrates view of the LED package according to the subject matter herein.

Referring now to FIG. 7, the heat transfer material 88 and metal leads 90 and 92 are illustrated prior to embedding or molding within body 82. Heat transfer material 88 can be parallel with metal leads 90 and 92, and comprise substantially similarly shaped cross-sections. For example, heat transfer material 88 can optionally be disposed between metal leads 90 and 92 and can comprise bending portions 114. It is also contemplated that in another aspect that thermal transfer material 88 and metal leads 90 and 92 can comprise any other suitable configuration other than having the thermal transfer material 88 disposed between metal leads 90 and 92. As FIG. 6 illustrates, bending portions 114 can be embedded within body 82 and configured to transform the heat transfer material 88 from having top surface 106 that can be substantially flat along a plane P4 to a second, embedded top surface 116 that can be substantially flat and located or disposed along a parallel plane P3 that can be located above and/or higher than plane P4. Heat transfer material 88 can then terminate with exposed portions 100 at least substantially flush along opposing lateral sides of LED package 80 such that no significant portion of the heat transfer material 88 extends beyond the outermost edges of lateral sides 71-74 of the LED package 80. Likewise, metal leads 90 and 92 can comprise bending portions 115 and 117, respectively. Just as the bending portions 114 of heat transfer material 88, the bending portions 115 and 117 of metal leads 90 and 92 can be embedded within body 82. Bending portions 115 and 117 can be configured to transform the metal leads 90 and 92 from having top surfaces 91 and 93 which lie substantially flat along plane P4, to having second embedded top surfaces 118 and 119, respectively, that can be substantially flat and located or disposed along a parallel plane P3 that can be above and/or higher than plane P4. Metal leads 90 and 92 can then terminate with exposed portions 102 and 104, respectively, which can be at least substantially flush along opposing lateral sides of LED package 80 such that no significant portion of the metal leads 90 and 92 extends beyond the outermost edges of the lateral sides 71-74 of the LED package 80.

Figure 8:
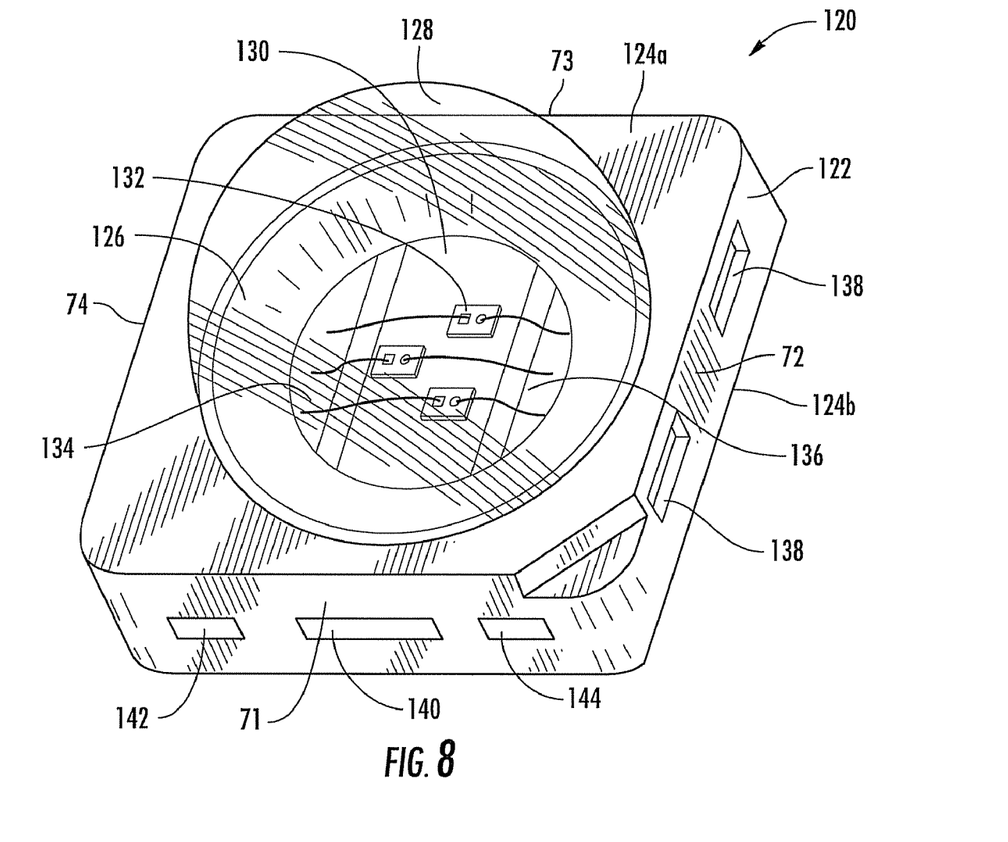
FIG. 8 illustrates a perspective top view of an embodiment of a LED package with electrical and thermal elements according to the subject matter herein.

FIG. 8 illustrates a perspective top view of an embodiment of a low-cost LED package, generally designated 120 having an isolated thermal path. FIG. 8 has features which can correspond in form and function with FIG. 3. For example, LED package 120 can comprise a body 122 with four external lateral sides 71-74, a top surface 124*a*, and a bottom surface 124*b*. Body 122 can comprise any suitable material known in the art for example ceramic, molded plastic, thermoset, or thermoplastic materials. Body 122 can comprise a reflector cavity 126 for reflection of light thereby increasing light output. A lens 128 can be formed, for example by molding lens 128 over the reflector cavity 126 and can be used for controlling optical properties such as, brightness and the focus. Lens 128 can be generally convex but can comprise any suitable size and/or shape known in the art. Lens 128 can optionally comprise a phosphor for obtaining a desired wavelength spectrum.

A thermal element and at least one electrical element can lie along a bottom surface of reflector cavity 126. The thermal element can comprise a heat transfer material 130, for example a heat slug, upon which one or more LED chips 132 can be mounted. It is also contemplated in another aspect that one or more LED chips 132 can be thermally connected to heat transfer material 130 indirectly using another suitable configuration. For example, one or more intervening layers may be present between LED chips 108 and top surface 106 of heat transfer material 88. The electrical element can comprise one or more metal leads, for example, metal leads 134 and 136. Thermal transfer material 130 can optionally be disposed between metal leads 134 and 136 and can be thermally and electrically isolated from metal leads 134 and 136 by insulating portions 94 and 96 of molded body 82 which can form for example, during the molding process when molded material flows into divided areas between the thermal transfer material 130 and metal leads 134 and 136. It is also contemplated that in another aspect that thermal transfer material 130 and metal leads 134 and 136 can comprise any other suitable configuration other than having the thermal transfer material 130 disposed between metal leads 134 and 136. Portions of heat transfer material 130 and metal leads 134 and 136 can thus be embedded within body 122. Body 122 further comprises one or more retaining notches 138 located along one or more lateral sides, for example along opposing lateral sides 72 and 74 which can assist with singulation of LED package 120 by providing areas which can retain an array of LED packages 120 and hold the packages together until the appropriate time. Heat transfer material 130 and metal leads 134 and 136 terminate at exposed portions 140, 142, and 144, respectively such that exposed portions 140, 142, and 144 are at least substantially flush with and do not have a significant portion extending beyond an outermost edge of the lateral sides 71-74. Exposed portions 140, 142, and 144 of the heat transfer material 130 and metal leads 134 and 136, respectively, terminate at opposing lateral sides, for example 71 and 73. Heat transfer material 130 and metal leads 134 and 136 can be generally parallel within body 122. Bottom and cross-sectional views of this embodiment can correspond in form and feature with those of FIGS. 4-7 and further comprise lens 128 about reflector cavity 126. Lens 128 can be formed integral with encapsulant E or as a separate portion. For example lens 128 can comprise a separately formed glass portion having any size and/or shape which can optionally be disposed above the encapsulant E. In the alternative, lens 128 can optionally comprise a single, molded lens comprising encapsulant E molded to form lens 128 of any size and/or shape about reflector cavity 126 of LED package 120.

Embodiments of the present disclosure shown in the drawings and described above are exemplary of numerous embodiments that can be made within the scope of the appended claims. It is contemplated that the configurations of LED packages such as those disclosed herein can comprise numerous configurations other than those specifically disclosed.

What is claimed is:

1. A light emitting diode (LED) package, the package comprising:
a body comprising at least a portion of a thermal element and at least a portion of an electrical element, both of which are embedded within the body and extend directly from a bottom surface of the body, the thermal element being electrically isolated from the electrical element; and at least one light emitting device thermally connected to the thermal element and electrically connected to the electrical element;

wherein a top surface of the thermal element and a top surface of the electrical element are substantially flush with a bottom surface of a reflector cavity formed in the body.

2. The LED package according to claim 1, wherein the thermal element comprises a substantially same thickness as the electrical element within the body.

3. The LED package according to claim 1, wherein the top surface of the thermal element is disposed along a lower plane than an embedded top surface of the thermal element.

4. The LED package according to claim 3, wherein the thermal element comprises a bending portion embedded within the body that transitions the top surface of the thermal element into the embedded top surface of the thermal element.

5. The LED package according to claim 4, wherein the thermal element comprises a longitudinal axis orthogonal to opposing lateral sides upon which exposed portions of the thermal element are located, the exposed portions of the thermal element being substantially flush with the opposing lateral sides of the body.

6. The LED package according to claim 4, wherein the electrical element comprises a longitudinal axis that is parallel to a longitudinal axis of the thermal element and orthogonal to opposing lateral sides upon which exposed portions of the electrical element are located, the exposed portions of the electrical element being substantially flush with the opposing lateral sides of the body.

7. The LED package according to claim 1, wherein the thermal element is electrically isolated from the electrical element by an insulating portion of the body.

8. The LED package according to claim 1, further comprising a lens.

9. The LED package according to claim 1, wherein an encapsulant is disposed within the reflector cavity.

10. The LED package according to claim 1, wherein the thermal element and electrical element only extend directly from a bottom surface of the body.

11. The LED package according to claim 1, wherein the thermal element and electrical element are only embedded on two opposing lateral sides of the body.

12. A light emitting diode (LED) package, the package comprising:

a body comprising at least a portion of a thermal element and at least a portion of an electrical element both embedded within the body and extending directly from a bottom surface of the body, the thermal element and electrical element comprising bottom surfaces which are substantially flush with the bottom surface of the body; and at least one light emitting device thermally connected to the thermal element and electrically connected to the electrical element.

13. The LED package according to claim 12, wherein the thermal element is electrically isolated from the electrical element by an insulating portion of the body.

14. The LED package according to claim 12, wherein a top surface of the thermal element and a top surface of the electrical element are flush with a bottom surface of a reflector cavity formed in the body.

15. The LED package according to claim 12, wherein an encapsulant is disposed in the reflector cavity.

16. The LED package according to claim 12, wherein a top surface of the thermal element is disposed along a lower plane than an embedded top surface of the thermal element.

17. The LED package according to claim 16, wherein the thermal element comprises a bending portion embedded within the body that transitions the top surface of the thermal element into the embedded top surface of the thermal element.

18. The LED package according to claim 17, wherein the thermal element comprises a longitudinal axis orthogonal to opposing lateral sides upon which exposed portions of the thermal element are located, the exposed portions of the thermal element being substantially flush with opposing lateral sides of the body.

19. The LED package according to claim 18, wherein the electrical element comprises a longitudinal axis parallel to the longitudinal axis of the thermal element and orthogonal to opposing lateral sides upon which exposed portions of the electrical element are located, the exposed portions of the electrical element being substantially flush with opposing lateral sides of the body.

20. The LED package according to claim 12, wherein the thermal element and electrical element only extend directly from a bottom surface of the body.

21. The LED package according to claim 12, wherein the thermal element and electrical element are only embedded in two opposing lateral sides of the body.

22. A light emitting diode (LED) package, the package comprising:

a body comprising at least a portion of a thermal element and at least a portion of an electrical element, both of which are embedded within the body and extend directly from a bottom surface of the body, the thermal element being electrically isolated from the electrical element; and at least one light emitting device thermally connected to the thermal element and electrically connected to the electrical element;

wherein a top surface of the thermal element is disposed along a lower plane than an embedded top surface of the thermal element.

23. A light emitting diode (LED) package, the package comprising:

a body comprising at least a portion of a thermal element and at least a portion of an electrical element, both of which are embedded within the body and extend directly from a bottom surface of the body, the thermal element being electrically isolated from the electrical element; and at least one light emitting device thermally connected to the thermal element and electrically connected to the electrical element;

wherein a top surface of the thermal element is disposed along a lower plane than an embedded top surface of the thermal element; and wherein the thermal element comprises a bending portion embedded within the body that transitions the top surface of the thermal element into the embedded top surface of the thermal element.

24. A light emitting diode (LED) package, the package comprising:

a body comprising at least a portion of a thermal element and at least a portion of an electrical element, both of which are embedded within the body and extend directly from a bottom surface of the body, the thermal element being electrically isolated from the electrical element; and at least one light emitting device thermally connected to the thermal element and electrically connected to the electrical element;

wherein a top surface of the thermal element is disposed along a lower plane than an embedded top surface of the thermal element;

wherein the thermal element comprises a bending portion embedded within the body that transitions the top surface of the thermal element into the embedded top surface of the thermal element; and wherein the thermal element comprises a longitudinal axis orthogonal to opposing lateral sides upon which exposed portions of the thermal element are located, the exposed portions of the thermal element being substantially flush with the opposing lateral sides of the body.

25. A light emitting diode (LED) package, the package comprising:

a body comprising at least a portion of a thermal element and at least a portion of an electrical element, both of which are embedded within the body and extend directly from a bottom surface of the body, the thermal element being electrically isolated from the electrical element; and at least one light emitting device thermally connected to the thermal element and electrically connected to the electrical element;

wherein a top surface of the thermal element is disposed along a lower plane than an embedded top surface of the thermal element;

wherein the thermal element comprises a bending portion embedded within the body that transitions the top surface of the thermal element into the embedded top surface of the thermal element; and wherein the electrical element comprises a longitudinal axis that is parallel to a longitudinal axis of the thermal element and orthogonal to opposing lateral sides of the body upon which exposed portions of the electrical element are located, the exposed portions of the electrical element being substantially flush with the opposing lateral sides of the body.

26. A light emitting diode (LED) package, the package comprising:

a body comprising at least a portion of a thermal element and at least a portion of an electrical element, both of which are embedded within the body and extend directly from a bottom surface of the body, the thermal element being electrically isolated from the electrical element; and at least one light emitting device thermally connected to the thermal element and electrically connected to the electrical element;

wherein a top surface of the thermal element and a top surface of the electrical element are substantially flush with a bottom surface of a reflector cavity formed in the body; and wherein an encapsulant is disposed within the reflector cavity.

27. A light emitting diode (LED) package, the package comprising:

a body comprising at least a portion of a thermal element and at least a portion of an electrical element, both of which are embedded within the body and extend directly from a bottom surface of the body, the thermal element being electrically isolated from the electrical element; and at least one light emitting device thermally connected to the thermal element and electrically connected to the electrical element;

wherein the thermal element and electrical element are only embedded on two opposing lateral sides of the body.

28. A light emitting diode (LED) package, the package comprising:

a body comprising at least a portion of a thermal element and at least a portion of an electrical element, both of which are embedded within the body and extend directly from a bottom surface of the body, the thermal element being electrically isolated from the electrical element;

at least one light emitting device thermally connected to a mounting surface of the thermal element and electrically connected to the electrical element; and a top surface of the thermal element and a top surface of the electrical element being substantially flush with the mounting surface.

* * * * *